(12) United States Patent
Chan et al.

(10) Patent No.: US 9,520,471 B1
(45) Date of Patent: Dec. 13, 2016

(54) SEMICONDUCTOR DEVICE HAVING GRADIENT IMPLANT REGION AND MANUFACTURING METHOD THEREOF

(71) Applicant: Macronix International Co., Ltd, Hsinchu (TW)

(72) Inventors: Ching-Lin Chan, Hsinchu (TW); Cheng-Chi Lin, Toucheng Township (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/943,591

(22) Filed: Nov. 17, 2015

(51) Int. Cl.
*H01L 29/78* (2006.01)
*H01L 29/10* (2006.01)
*H01L 29/423* (2006.01)
*H01L 29/66* (2006.01)
*H01L 29/739* (2006.01)

(52) U.S. Cl.
CPC ..... *H01L 29/1095* (2013.01); *H01L 29/42368* (2013.01); *H01L 29/66681* (2013.01); *H01L 29/7393* (2013.01); *H01L 29/7816* (2013.01)

(58) Field of Classification Search
None
See application file for complete search history.

(56) References Cited

U.S. PATENT DOCUMENTS

2014/0175560 A1* 6/2014 Chan ................. H01L 21/02697
257/401
2015/0270388 A1* 9/2015 Chan ................... H01L 29/1087
257/343

\* cited by examiner

*Primary Examiner* — Ermias Woldegeorgis
(74) *Attorney, Agent, or Firm* — Finnegan, Henderson, Farabow, Garrett & Dunner LLP

(57) ABSTRACT

A semiconductor device includes a substrate having a first conductivity type, a high-voltage well having a second conductivity type and disposed in the substrate, a source well having the first conductivity type disposed in the high-voltage well, a drift region disposed in the high-voltage well and spaced apart from the source well, and a gradient implant region having the second conductivity type and disposed in the high-voltage well between the source well and the drift region.

20 Claims, 23 Drawing Sheets

SEMICONDUCTOR DEVICE HAVING GRADIENT IMPLANT REGION AND MANUFACTURING METHOD THEREOF

FIELD OF THE DISCLOSURE

The present disclosure relates to a semiconductor device and, more particularly, to a semiconductor device having a gradient implant region and a manufacturing method thereof.

BACKGROUND

Ultra-high voltage semiconductor devices are widely used in display devices, portable devices, and many other applications. Design goals of ultra-high voltage semiconductor devices include high breakdown voltage, low specific on-resistance, and high reliability in both room temperature and high temperature environments. However, as the dimensions of ultra-high voltage semiconductor devices scale down, it becomes challenging to achieve these design goals.

SUMMARY

According to an embodiment of the disclosure, a semiconductor device includes a substrate having a first conductivity type, a high-voltage well having a second conductivity type and disposed in the substrate, a source well having the first conductivity type disposed in the high-voltage well, a drift region disposed in the high-voltage well and spaced apart from the source well, and a gradient implant region having the second conductivity type and disposed in the high-voltage well between the source well and the drift region.

According to another embodiment of the disclosure, a method for manufacturing a semiconductor device includes providing a substrate having a first conductivity type, forming a high-voltage well having a second conductivity type in the substrate, forming a source well having the first conductivity type in the high-voltage well, forming a drift region in the high-voltage well and spaced apart from the source well, and forming a gradient implant region having the second conductivity type in the high-voltage well between the source well and the drift region.

The accompanying drawings, which are incorporated in and constitute a part of this application, illustrate disclosed embodiments and, together with the description, serve to explain the disclosed embodiments.

DETAILED DESCRIPTION

Reference will now be made in detail to the present embodiments, examples of which are illustrated in the accompanying drawings. Wherever possible, the same reference numbers will be used throughout the drawings to refer to the same or like parts.

Figure 1A:
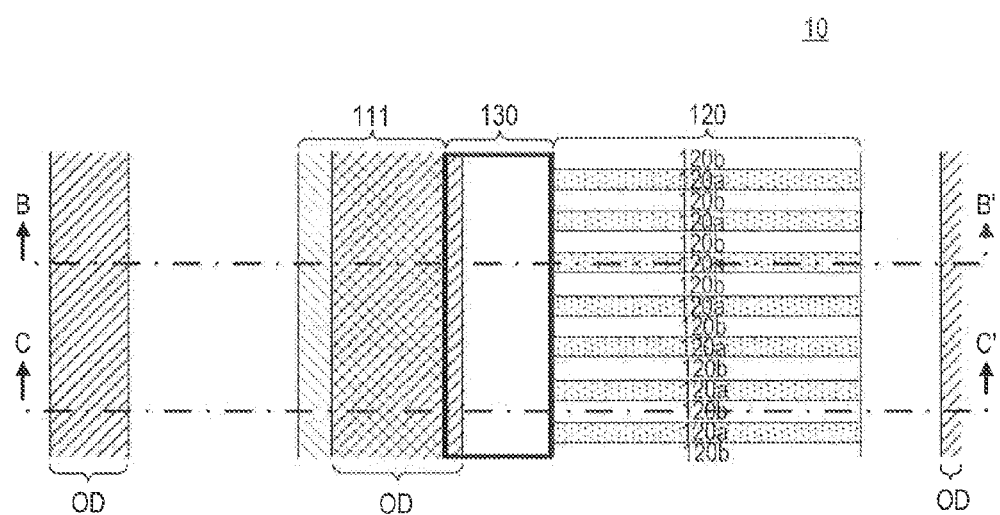
FIG. 1A schematically illustrates a top view of a semiconductor device, according to an illustrated embodiment.
Figure 1B:
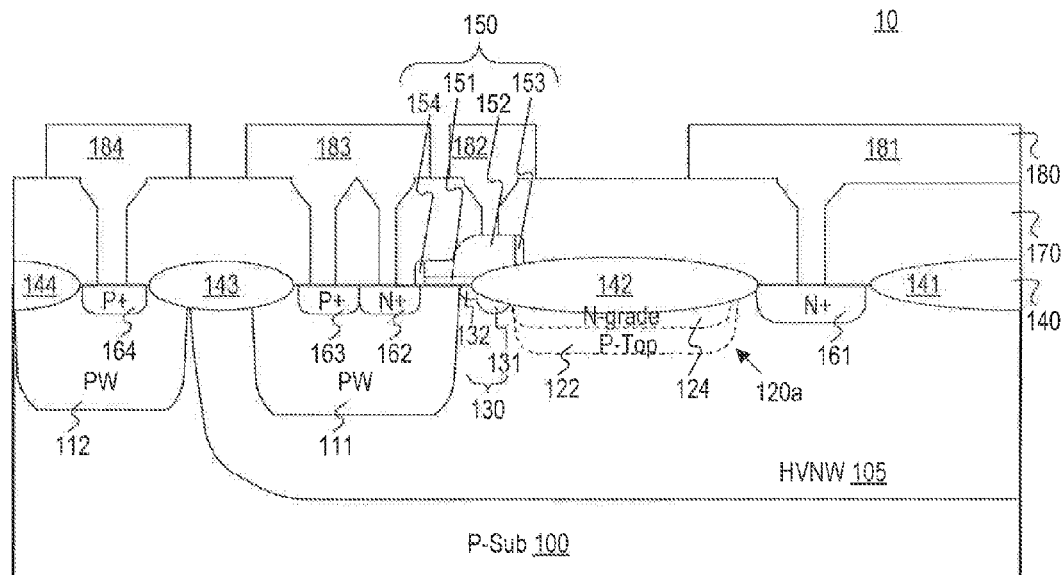
FIG. 1B is a cross-sectional view of the semiconductor device of FIG. 1A along section line B-B' of FIG. 1A.
Figure 1C:
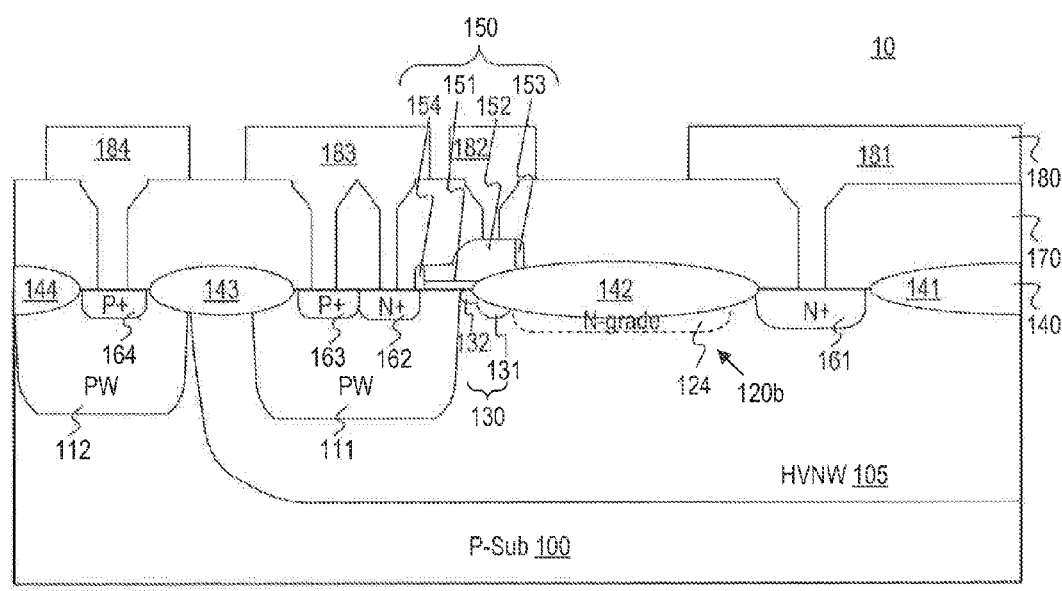
FIG. 1C is a cross-sectional view of the semiconductor device of FIG. 1A along section line C-C' of FIG. 1A.

FIG. 1A schematically illustrates a top view of a semiconductor device 10 (hereinafter referred to as "device 10") according to an illustrated embodiment. FIG. 1A illustrates oxide defined (OD) areas where no field oxide layer is formed. FIG. 1B is a cross-sectional view of device 10 along section line B-B' of FIG. 1A. FIG. 1C is a cross-sectional view of device 10 along section line C-C' of FIG. 1A.

As illustrated in FIGS. 1A-1C, device 10 includes a P-type substrate (P-sub) 100. Substrate 100 can be formed of a P-type bulk silicon material, a P-type epitaxial layer, or a P-type silicon-on-insulator (SOI) material. A high-voltage N-well (HVNW) 105 is disposed in substrate 100. A first P-well (PW) 111 is disposed in HVNW 105, close to and spaced apart from a left-side edge of HVNW 105, as viewed in FIGS. 1A-1C. First PW 111 constitutes a source well of device 10. Hereinafter, first PW 111 is referred to as "source well 111." A second PW 112 is disposed in substrate 100, outside and adjacent to the left-side edge of HVNW 105. A drift region 120 is disposed in HVNW 105 and spaced apart from a right-side edge of source well 111, as viewed in FIGS. 1A-1C. Drift region 120 includes a plurality of alternately arranged first sections 120a and second sections 120b. Each first section 120a includes a P-top region 122 and an N-grade region 124 disposed on P-top region 122. Each second section 120b includes N-grade region 124. In other words, N-grade region 124 is disposed in the entire drift region 120 including first sections 120a and second sections 120b, while P-top region is only disposed in first sections 120a.

An N-type gradient implant region 130 is disposed in HVNW 105, between drift region 120 and source well 111. A doping concentration of gradient implant region 130 has a gradient profile along a horizontal direction parallel to a major surface of substrate 100. In particular, as illustrated in FIGS. 1B and 1C, gradient implant region 130 includes a first portion 131 at a right-side of gradient implant region 130 and close to drift region 120, and a second portion 132 at a left-side of gradient implant region 130 and close to source well 111. The doping concentration of first portion 131 is higher than the doping concentration of second portion 132. In addition, a depth of first portion 131 is greater than a depth of second portion 132.

An insulation layer 140 is disposed on substrate 100. Insulation layer 140 can be made of field oxide (FOX). Hereinafter, insulation layer 140 is referred to as FOX layer 140. FOX layer 140 includes a first FOX portion 141 spaced apart from drift region 120, a second FOX portion 142 covering drift region 120, a third FOX portion 143 covering a left-side edge portion of source well 111, a left-side edge portion of HVNW 105, and a right-side edge portion of second PW 112, and a fourth FOX portion 144 covering a left-side edge portion of second PW 112.

Device 10 also includes a gate structure 150 disposed above substrate 100 and overlapping a left-side portion of second FOX portion 142 and a right-side edge portion of source well 111. Gate structure 150 includes a gate oxide layer 151, a gate layer 152, and sidewall spacers 153 and 154. Gate oxide layer 151 is disposed above substrate 100 and adjacent to second FOX portion 142. Gate oxide layer 151 overlaps second portion 132 of gradient implant region 130 and the right-side edge portion of source well 111. Gate layer 152 is disposed above gate oxide layer 151, and overlaps the left-side portion of second FOX portion 142, the region of HVNW 105 between second FOX portion 142 and source well 111, and the right-side edge portion of source well 111. Spacer 153 is disposed on a right-side side wall of gate layer 152. Spacer 154 is disposed on a left-side side wall of gate layer 152, and a left-side side wall of gate oxide layer 151.

A first N$^+$-region 161 is disposed in HVNW 105 between first FOX portion 141 and second FOX portion 142. A second N$^+$-region 162 is disposed in source well 111 adjacent to spacer 154. A first P$^+$-region 163 is disposed in source well 111 adjacent to second N$^+$-region 162. A second P$^+$-region 164 is disposed formed in second PW 112 between third FOX portion 143 and fourth FOX portion 144. First N$^+$-region 161 constitutes a drain region of device 10. Second N$^+$-region 162 and first P$^+$-region 163 constitute a source region of device 10. Second P$^+$-region 164 constitutes a bulk region of device 10.

Device 10 further includes an interlayer dielectric (ILD) layer 170 disposed over substrate 100. ILD layer 170 includes a plurality of through holes that expose various regions of substrate 100. A contact layer 180 is a layer of conductive material disposed over ILD layer 170. Contact layer 180 includes a plurality of isolated contact portions for conductively contacting various regions of substrate 100 via the plurality of through holes of ILD layer 170. Specifically, contact layer 180 includes a first contact portion 181 overlapping and contacting first N$^+$-region 161, a second contact portion 182 overlapping and contacting gate layer 152, a third contact portion 183 overlapping and contacting second N$^+$-region 162 and first P$^+$-region 163, and a fourth contact portion 184 overlapping and contacting second P$^+$-region 164. Additional dielectric layers and contact layers may be formed above contact layer 180.

Figure 2A:
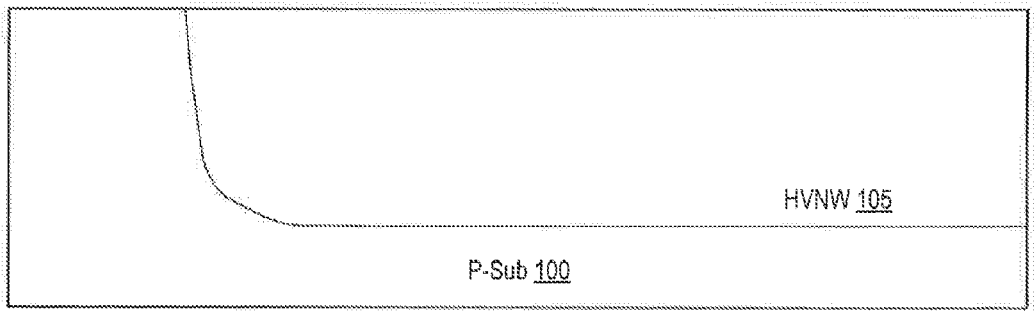
FIGS. 2A-17B schematically illustrate a process of fabricating the semiconductor device of FIGS. 1A-1C, according to an illustrated embodiment.
Figure 2B:
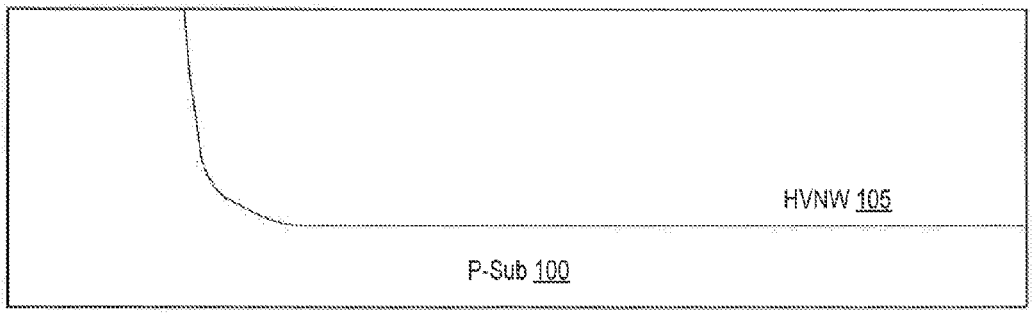
Figure 3A:
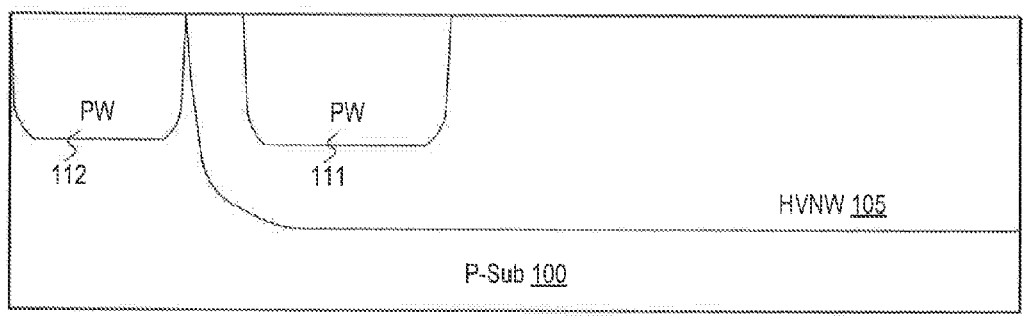
Figure 3B:
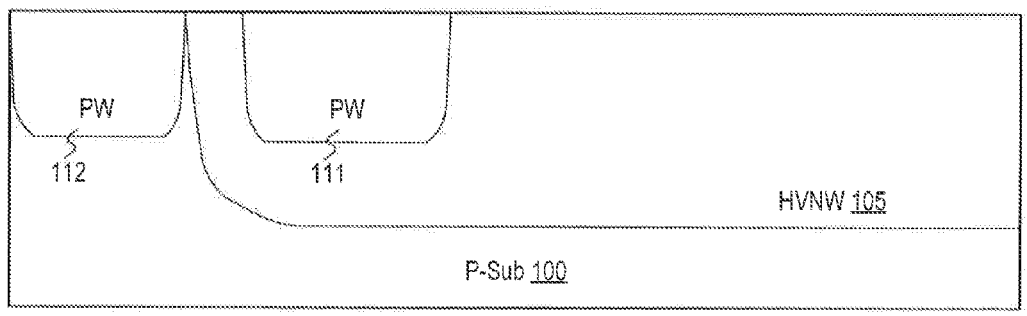
Figure 4A:
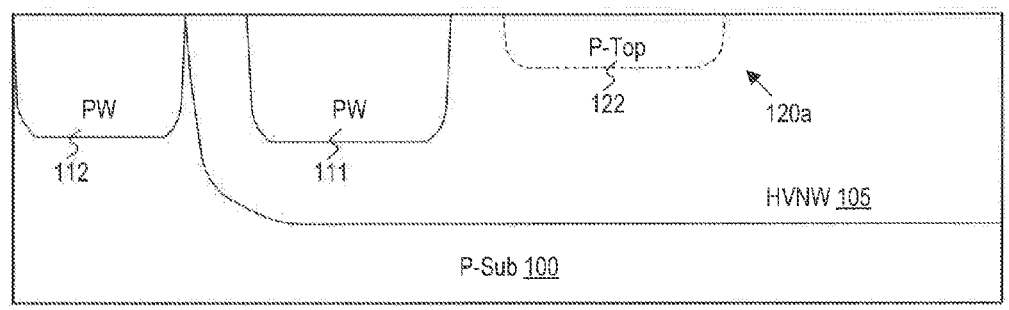
Figure 4B:
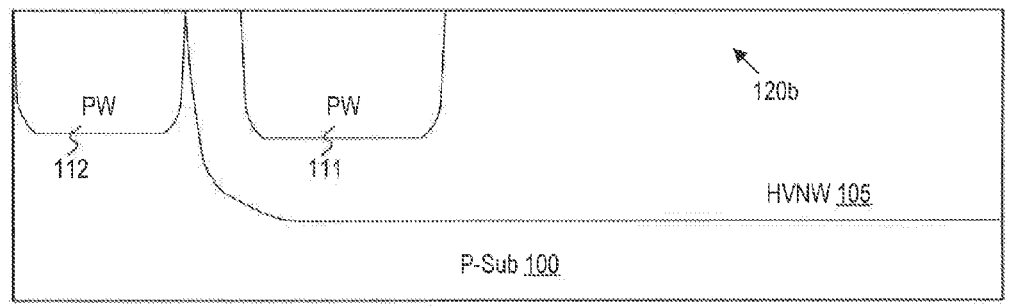

FIGS. 2A-17B schematically illustrate a process of fabricating device 10 of FIGS. 1A-1C, according to an illustrated embodiment. FIGS. 2A, 3A, 4A, . . . , 17A schematically illustrate partial cross-sectional views of device 10 taken along section line B-B' of FIG. 1A during steps of the process of fabricating device 10. FIGS. 2B, 3B, 4B, . . . , 17B schematically illustrate partial cross-sectional views of device 10 taken along section line C-C' of FIG. 1A during steps of the process of fabricating device 10.

First, referring to FIGS. 2A and 2B, substrate 100 is provided. HVNW 105 is formed in substrate 100 and extends downward from a top surface of substrate 100. Substrate 100 can be formed of a P-type bulk silicon material, a P-type epitaxial layer, or a P-type silicon-on-insulator (SOI) material. HVNW 105 can be formed by, for example, a photolithography process that defines a region where HVNW 105 is to be formed, an ion implantation process that implants an N-type dopant (e.g., phosphorus or arsenic) at a concentration of about $10^{11}$ to $10^{13}$ atoms/cm$^2$ into the defined region, and a heating process that drives in the implanted dopant to reach a predetermined depth.

Referring to FIGS. 3A and 3B, source well 111 is formed in HVNW 105, close to and spaced apart from the left-side edge portion of HVNW 105. Second PW 112 is formed in substrate 100, outside and adjacent to the left-side edge portion of HVNW 105. Source well 111 and second 112 can be formed by, for example, a photolithography process that defines regions where source well 111 and second PW 112 are to be formed, an ion implantation process that implants a P-type dopant (e.g., boron) at a concentration of about $10^{12}$ to $10^{14}$ atoms/cm$^2$ into the defined regions, and a heating process that drives in the implanted dopant to reach a predetermined depth.

Referring to FIGS. 4A and 4B, P-top region 122 is formed in HVNW 105, in regions corresponding to first sections 120a illustrated in FIG. 1A. No P-top region 122 is formed in regions corresponding to second sections 120b illustrated in FIG. 1A. P-top region 122 can be formed by, for example, a photolithography process that defines first sections 120a, and an ion implantation process that implants a P-type dopant (e.g., boron) at a concentration of about $10^{11}$ to $10^{14}$ atoms/cm$^2$ into first sections 120a.

Figure 5A:
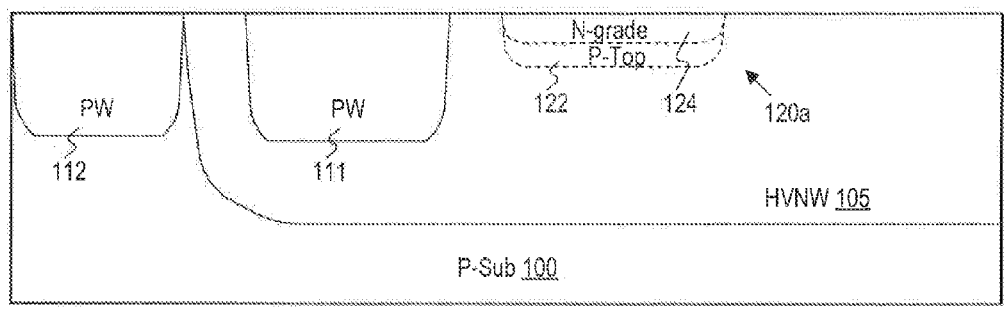
Figure 5B:
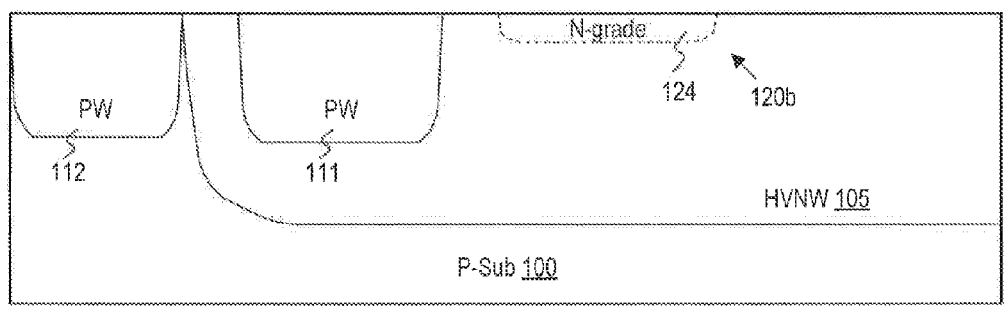

Referring to FIGS. 5A and 5B, N-grade region 124 is formed in HVNW 105, in a region corresponding to both first sections 120a and second sections 120b illustrated in FIG. 1A. N-grade region 124 can be formed by, for example, a photolithography process that defines a region in HVNW 105 where N-grade region 124 is to be formed, and an ion implantation process that implants an N-type dopant (e.g., phosphorus or arsenic) at a concentration of about $10^{11}$ to $10^{14}$ atoms/cm$^2$ into the defined region.

Figure 6A:
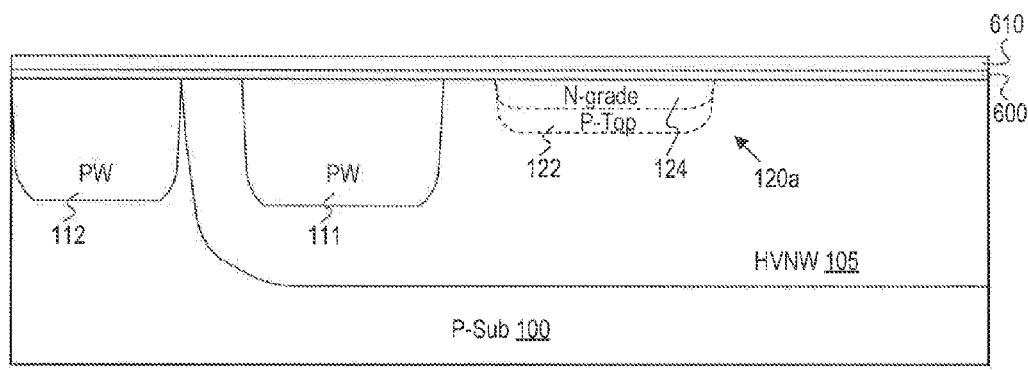
Figure 6B:
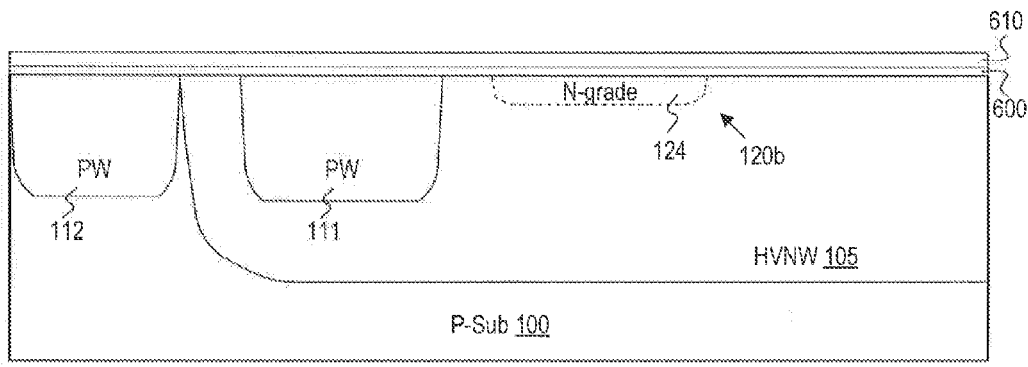

Referring to FIGS. 6A and 6B, a pad oxide layer 600 is formed on the entire surface of the structure of FIGS. 5A and 5B. Pad oxide layer 600 can be formed by, for example, oxidation. A nitride layer 610 is formed on the entire surface of pad oxide layer 600. Nitride layer 610 can be formed by, for example, deposition.

Figure 7A:
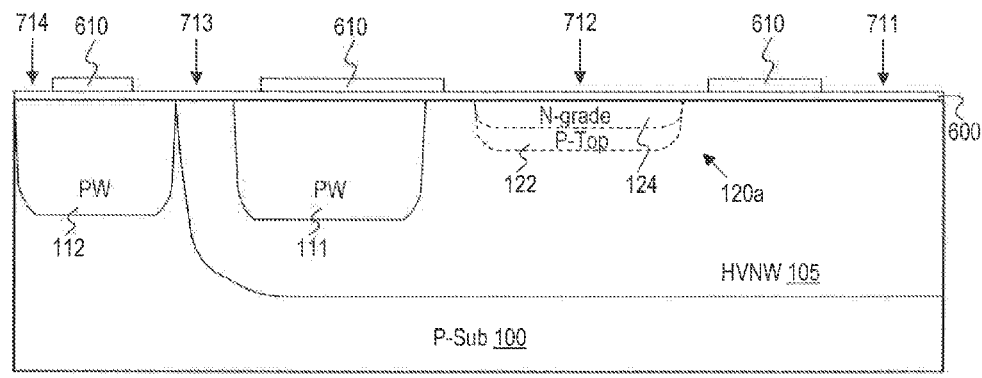
Figure 7B:
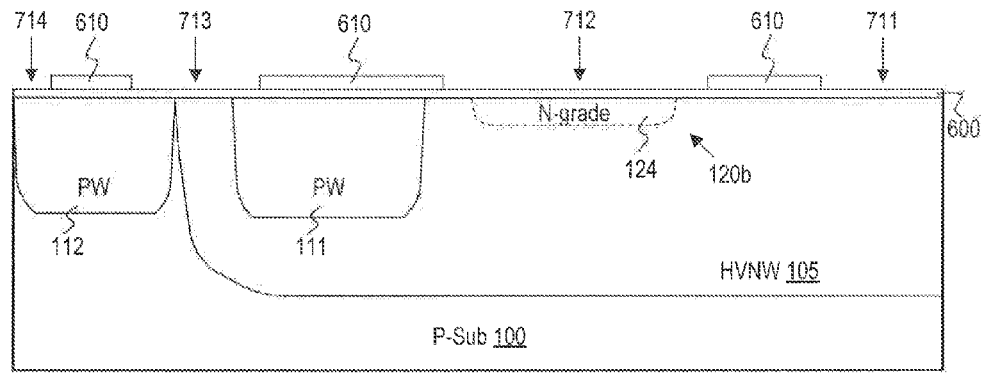

Referring to FIGS. 7A and 7B, first through fourth openings 711-714 are formed in nitride layer 610 to expose active device regions to be formed in substrate 100. In particular, first opening 711 exposes a right-side region of HVNW 105. Second opening 712 exposes drift region 120 including sections 120a and 120b, a portion of HVNW 105 close to a right-side edge of drift region 120, and a portion of HVNW 105 close to a left-side edge of drift region 120. Third opening 713 exposes a left-side edge portion of source well 111, a left-side edge portion of HVNW 105, and a right-side edge portion of second PW 112. Fourth opening 714 exposes a left-side edge portion of second PW 112. First through fourth openings 711-714 can be formed by, for example, a photolithography process that defines regions in nitride layer 610 where first through fourth openings 711-714 are to be formed, and an etching process that removes nitride material in the defined regions.

Figure 8A:
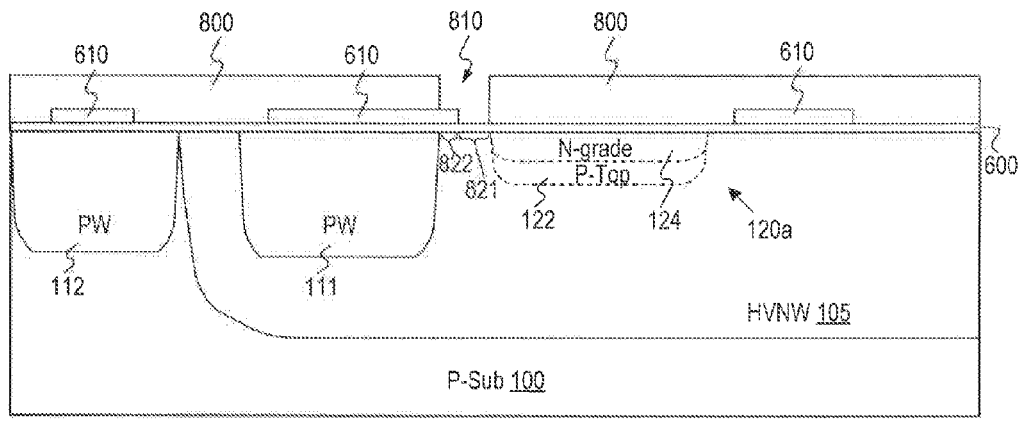
Figure 8B:
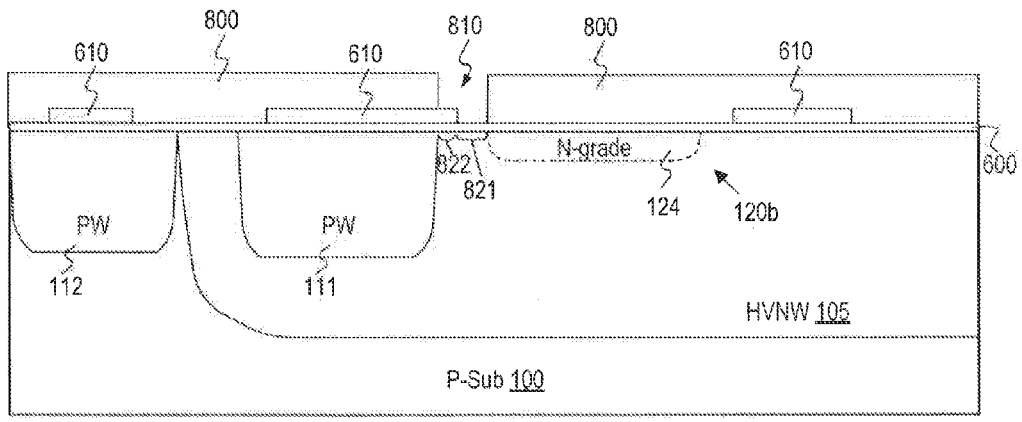

Referring to FIGS. 8A and 8B, a photoresist layer 800 including an opening 810 is formed on the structure of FIGS. 7A and 7B. Opening 810 exposes a region in HVNW 105 between drift region 120 and source well 111, where gradient implant region 130 is to be formed. Photoresist layer 800 including opening 810 can be formed by, for example, a photolithography process. The region in HVNW 105 exposed by opening 810 is partially covered by nitride layer 610. That is, HVNW 105 includes a first region 821 not covered by either of photoresist layer 800 and nitride layer 610, and a second region 822 not covered by photoresist layer 800 but covered by nitride layer 610.

Figure 9A:
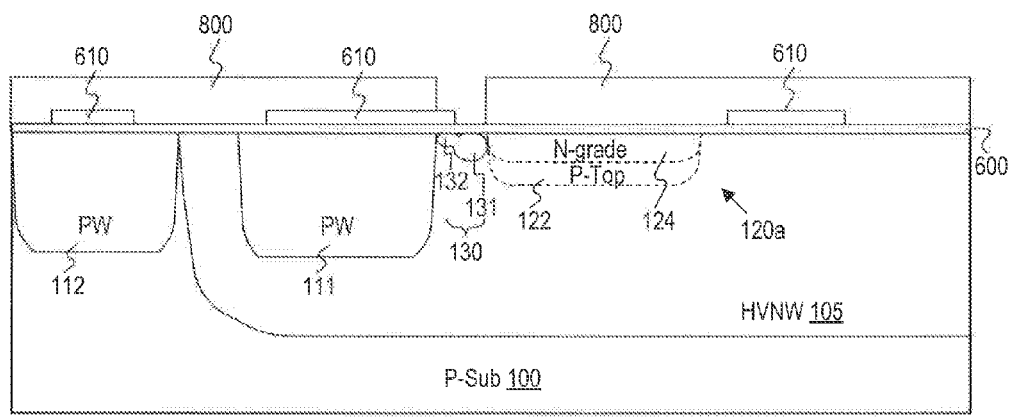
Figure 9B:
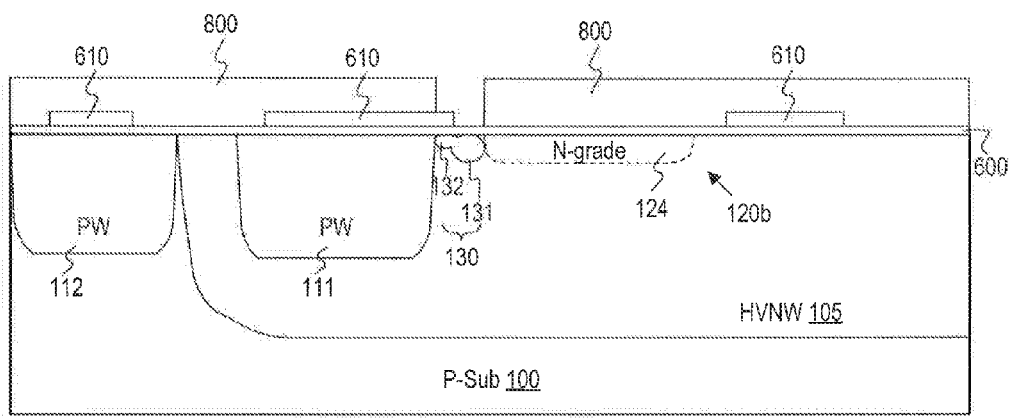

Referring to FIGS. 9A and 9B, gradient implant region 130 is formed in the region in HVNW 105 defined by opening 810 of photoresist layer 800. Gradient implant region 130 includes first portion 131 in first region 821 of HVNW 105 not covered by either of photoresist layer 800 and nitride layer 610, and second portion 132 in second region 822 of HVNW 105 not covered by photoresist layer 800 but covered by nitride layer 610. Gradient implant region 130 can be formed by, for example, an ion implantation process that implants an N-type dopant (e.g., phosphorus or arsenic) at a concentration of about $10^{12}$ to $10^{14}$ atoms/cm$^2$ into the defined region. The implantation dosage and implantation energy can be variable. During the ion implantation process, nitride layer 610 functions as an implantation hard mask to block off some of the dopant ions. As a result, first portion 131 has a higher doping concentration than second portion 132. In addition, a depth of first portion 131 is greater than a depth of second portion 132. After forming gradient implant region 130, photoresist layer 800 is removed.

Figure 10A:
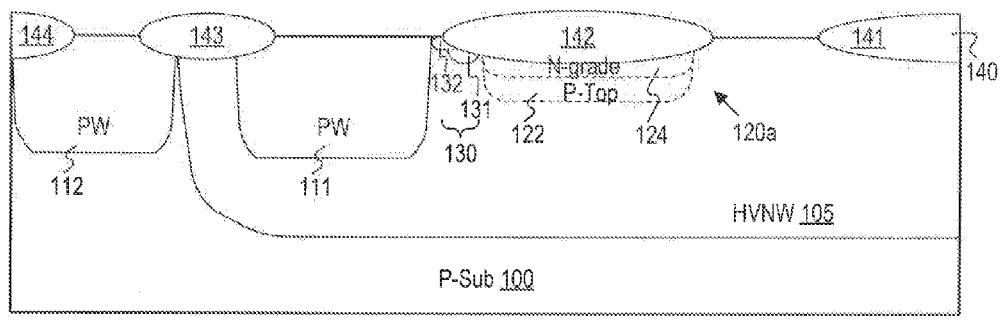
Figure 10B:
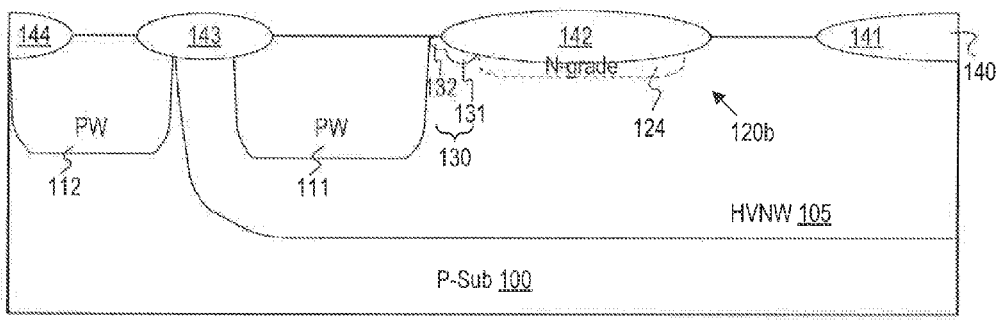

Referring to FIGS. 10A and 10B, FOX layer 140 is formed above the structure of FIGS. 9A and 9B. FOX layer 140 includes first through fourth FOX portions 141-144. FOX layer 140 can be formed by, for example, a thermal oxidation process that forms FOX layer 140 in regions of substrate 100 exposed by nitride layer 610. After forming FOX layer 140, nitride layer 610 and pad oxide layer 600 are removed.

Figure 11A:
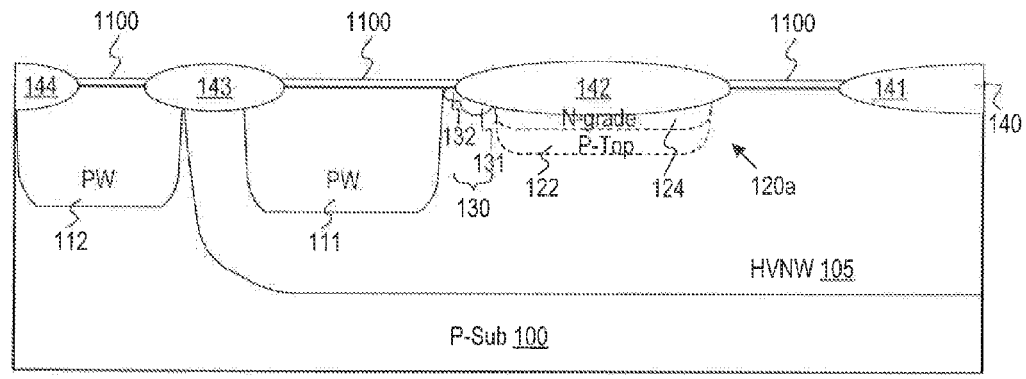
Figure 11B:
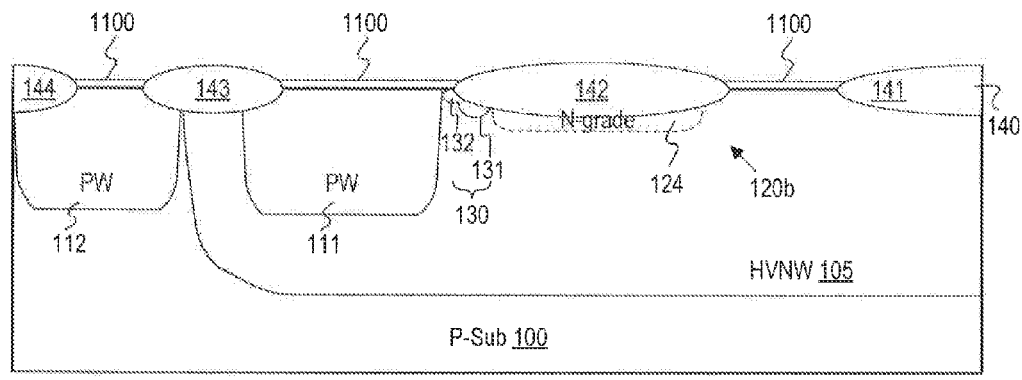

Referring to FIGS. 11A and 11B, a gate oxide layer 1100 is formed on surface portions of the structure of FIGS. 10A and 10B. A first portion of gate oxide layer 1100 is formed between first FOX portion 141 and second FOX portion 142, a second portion of gate oxide layer 1100 is formed between second FOX portion 142 and third FOX portion 143, and a third portion of gate oxide layer 1100 is formed between third FOX portion 143 and fourth FOX portion 144. Gate oxide layer 1100 can be formed by, for example, a sacrificial oxidation process that forms a sacrificial oxide layer, a cleaning process that removes the sacrificial oxide layer, and an oxidation process that forms gate oxide layer 1100.

Figure 12A:
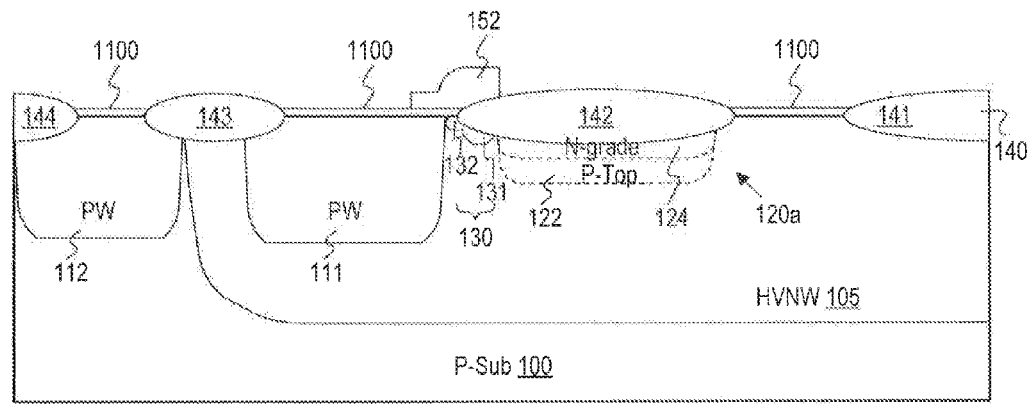
Figure 12B:
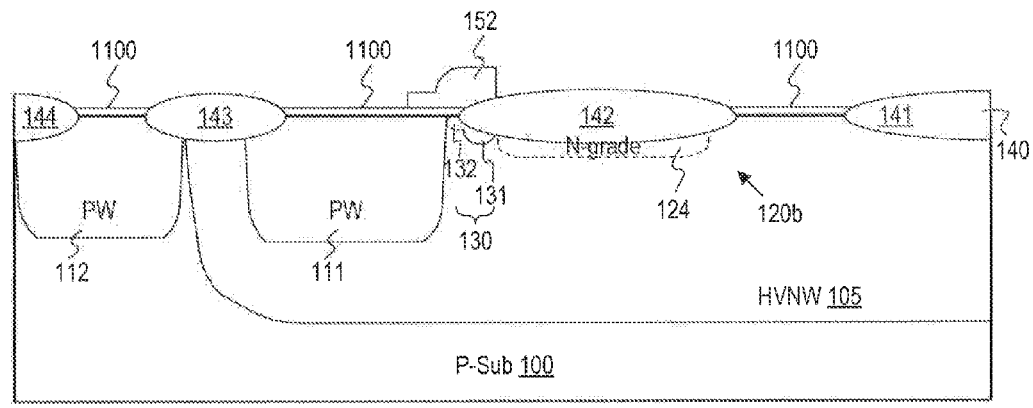

Referring to FIGS. 12A and 12B, gate layer 152 is formed on gate oxide layer 1100, overlapping a left-side portion of second FOX portion 142 and a right-side edge portion of source well 111. Gate layer 152 can include a polysilicon layer and a tungsten silicide layer formed on the polysilicon layer. Gate layer 152 can be formed by, for example, a deposition process that deposits a polysilicon layer and a tungsten silicide layer over the entire surface of the structure of FIGS. 11A and 11B, a photolithography process that defines a region where gate layer 152 is to be formed, and an etching process that removes the polysilicon layer and the tungsten silicide layer outside the defined region. After forming gate layer 152, portions of gate oxide layer 1100 not covered by gate layer 152, are removed by etching. The portion of gate oxide layer 1100 covered by gate layer 152 constitutes gate oxide layer 151.

Figure 13A:
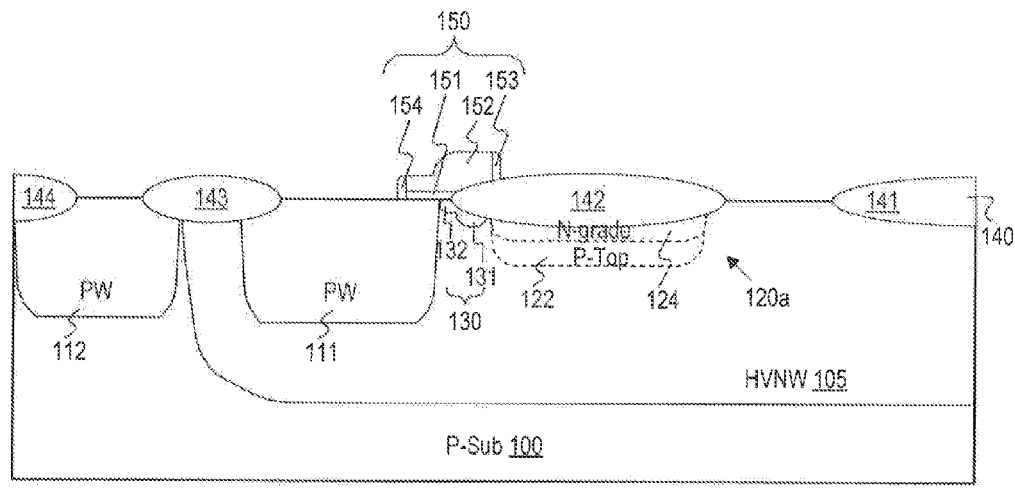
Figure 13B:
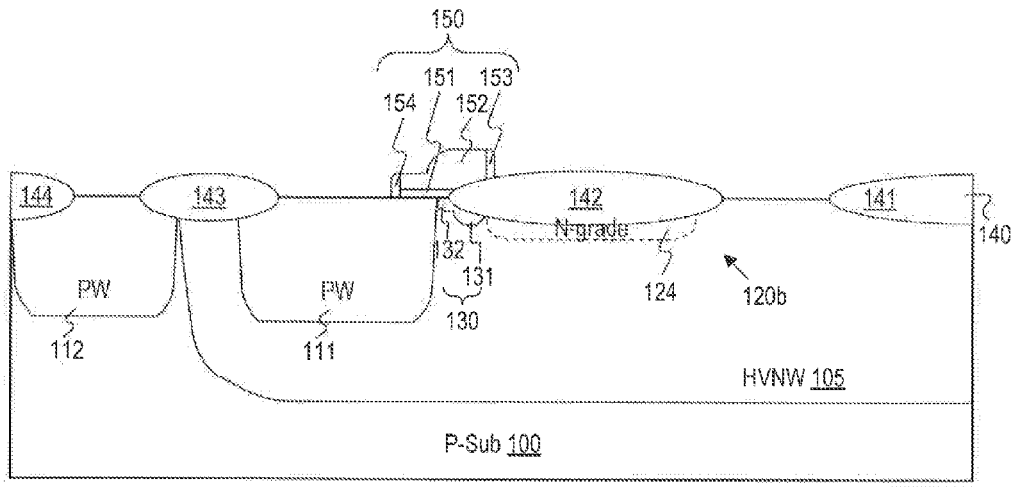

Referring to FIGS. 13A and 13B, spacer 153 is formed on a right-side side wall of gate layer 152. Spacer 154 is formed on a left-side side wall of gate layer 152, and a left-side side wall of gate oxide layer 151. Spacers 153 and 154 can be tetraethoxysilane (TEOS) oxide films. Spacers 153 and 154 can be formed by, for example, a deposition process that deposits the TEOS oxide film and an etching process that removes portions of the TEOS oxide film that are outside of regions where spacers 153 and 154 are to be formed.

Figure 14A:
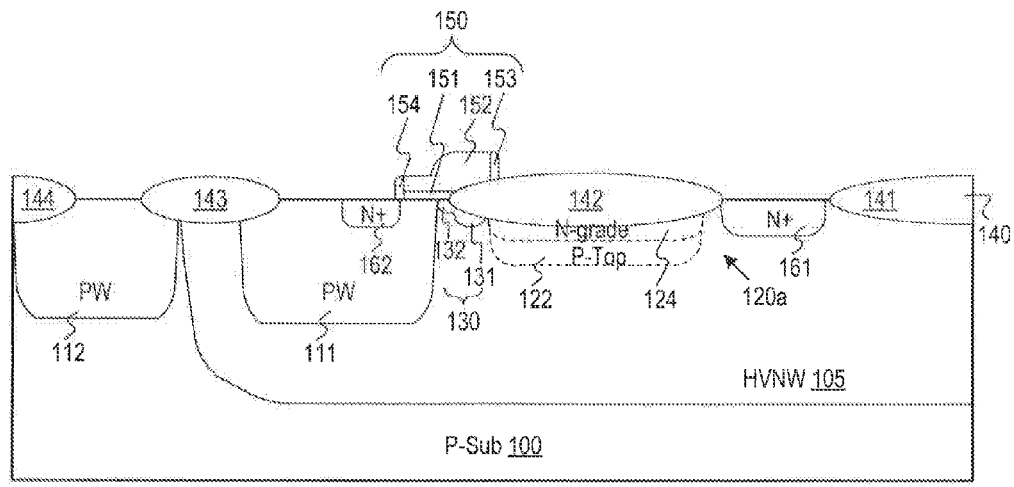
Figure 14B:
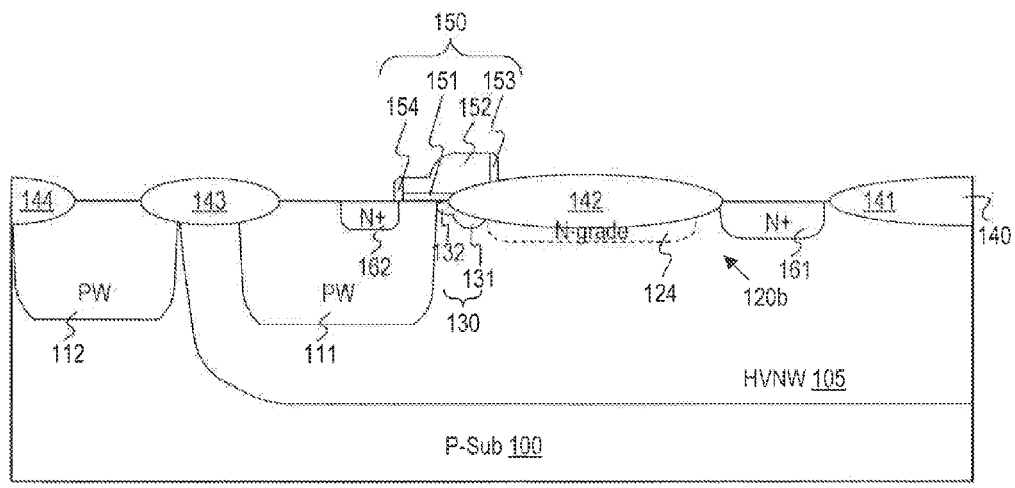

Referring to FIGS. 14A and 14B, first and second N$^+$-regions 161 and 162 are formed in substrate 100. First and second N$^+$-regions 161 and 162 are formed by a photolithography process that defines regions where first and second N$^+$-regions 161 and 162 are to be formed, and an ion implantation process that implants an N-type dopant (e.g., phosphorus or arsenic) at a concentration of about $10^{15}$ to $10^{16}$ atoms/cm$^2$ into the defined regions.

Figure 15A:
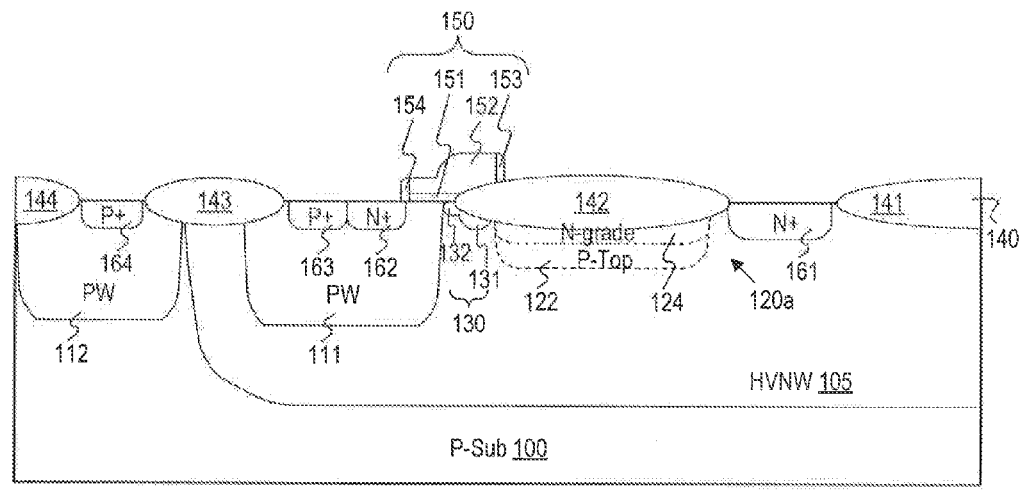
Figure 15B:
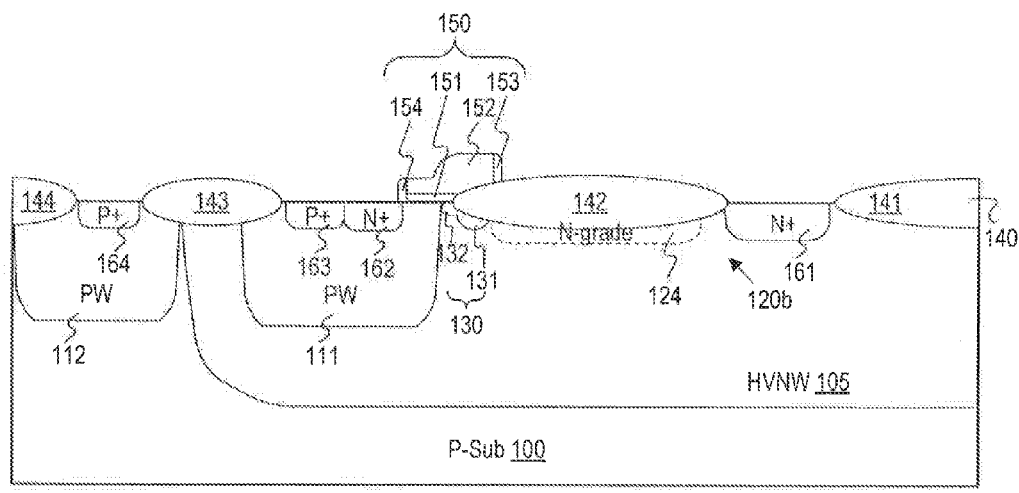

Referring to FIGS. 15A and 15B, first and second P$^+$-regions 163 and 164 are formed in substrate 100. First and second P+-regions 163 and 164 can be formed by a photolithography process that defines regions where first and second P$^+$-regions 163 and 164 are to be formed, and an ion implantation process that implants a P-type dopant (e.g., boron) at a concentration of about $10^{15}$ to $10^{16}$ atoms/cm$^2$ into the defined regions.

Figure 16A:
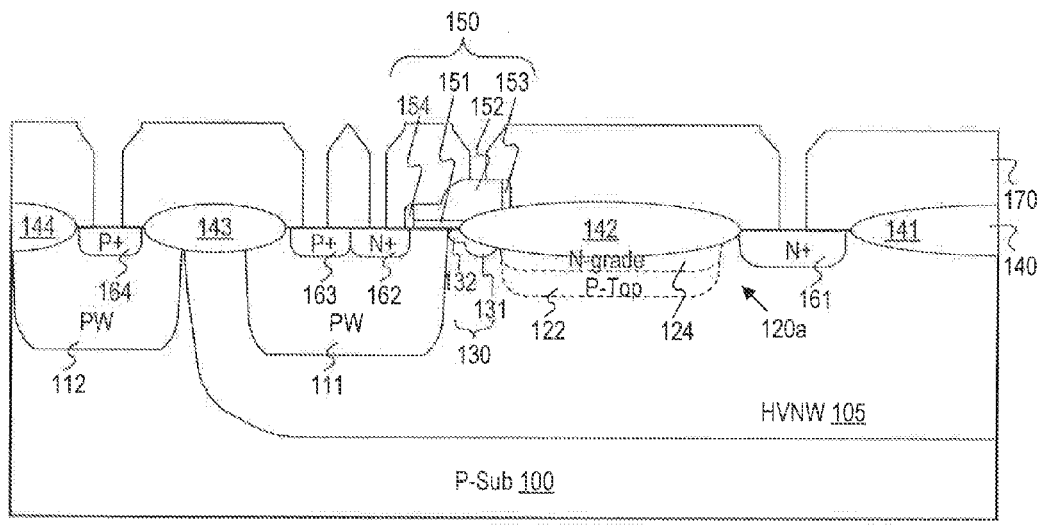
Figure 16B:
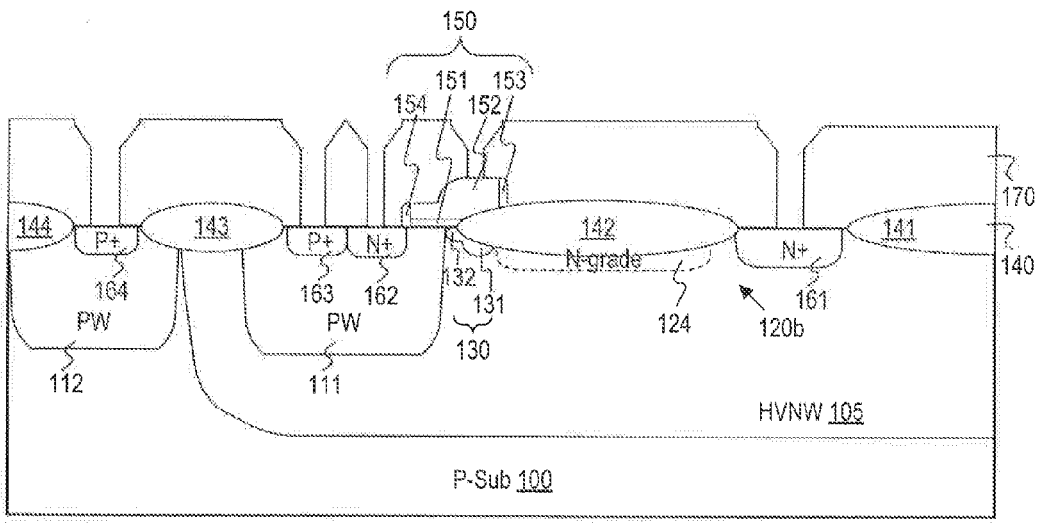

Referring to FIGS. 16A and 16B, ILD layer 170 is formed on the entire surface of the structure of FIGS. 15A and 15B. ILD layer 170 includes a plurality of through holes that expose various regions of substrate 100. ILD layer 170 can include undoped silicate glass (USG) and/or borophosphosilicate glass (BPSG). For example, ILD layer 170 can be formed by a deposition process that deposits a layer of USG and/or BPSG, a photolithography process that defines regions where the plurality of through holes are to be formed, and an etching process that removes the USG and/or BPSG in the defined regions.

Figure 17A:
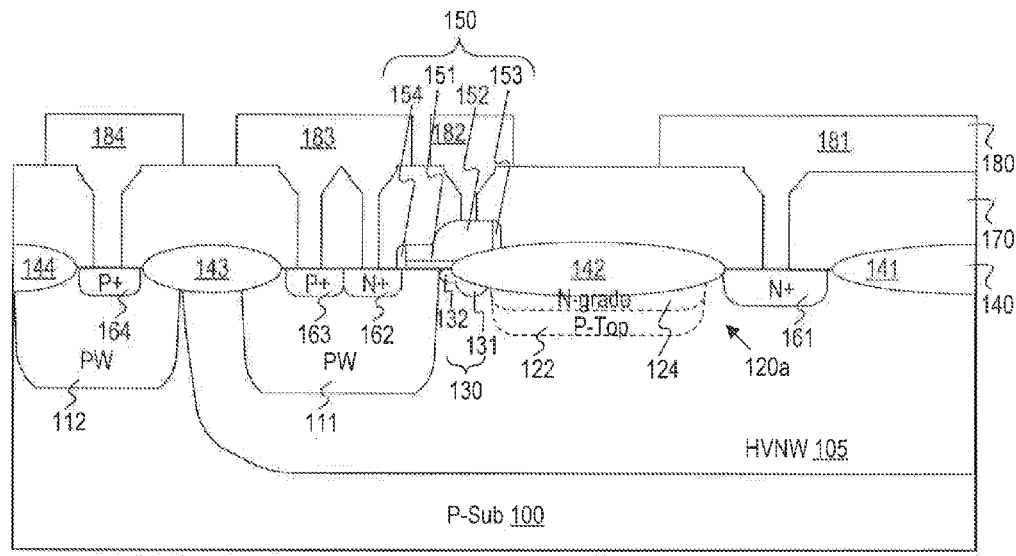
Figure 17B:
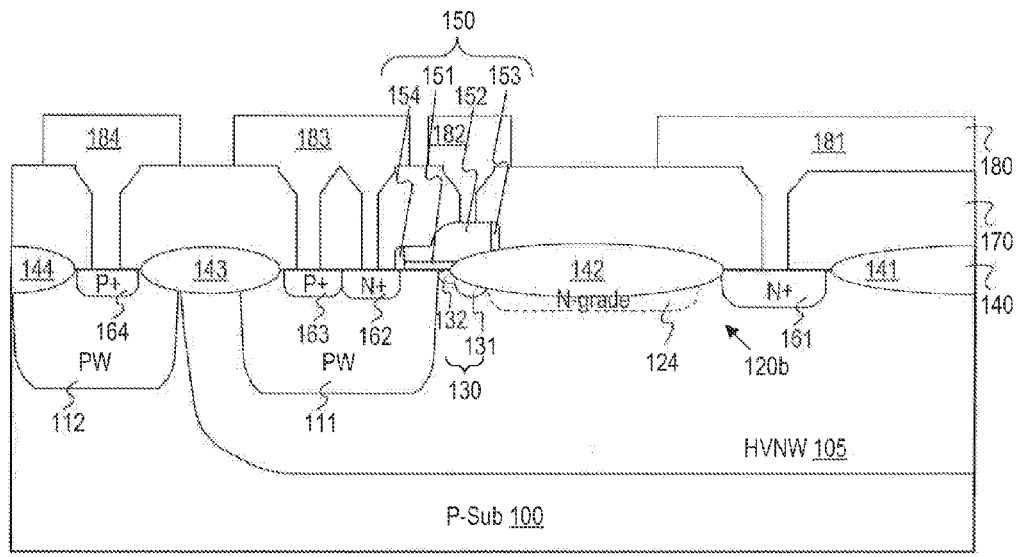

Referring to FIGS. 17A and 17B, contact layer 180 is formed on the structure of FIGS. 16A and 16B. Contact layer 180 includes first through fourth contact portions 181-184. Contact layer 180 can be made of metal, such as aluminum, or an aluminum-copper alloy. For example, contact layer 180 can be formed by a deposition process that deposits a metal layer, a photolithography process that defines regions where first through fourth contact portions 181-184 are to be formed, and an etching process that removes the metal outside of the defined regions.

Figure 18:
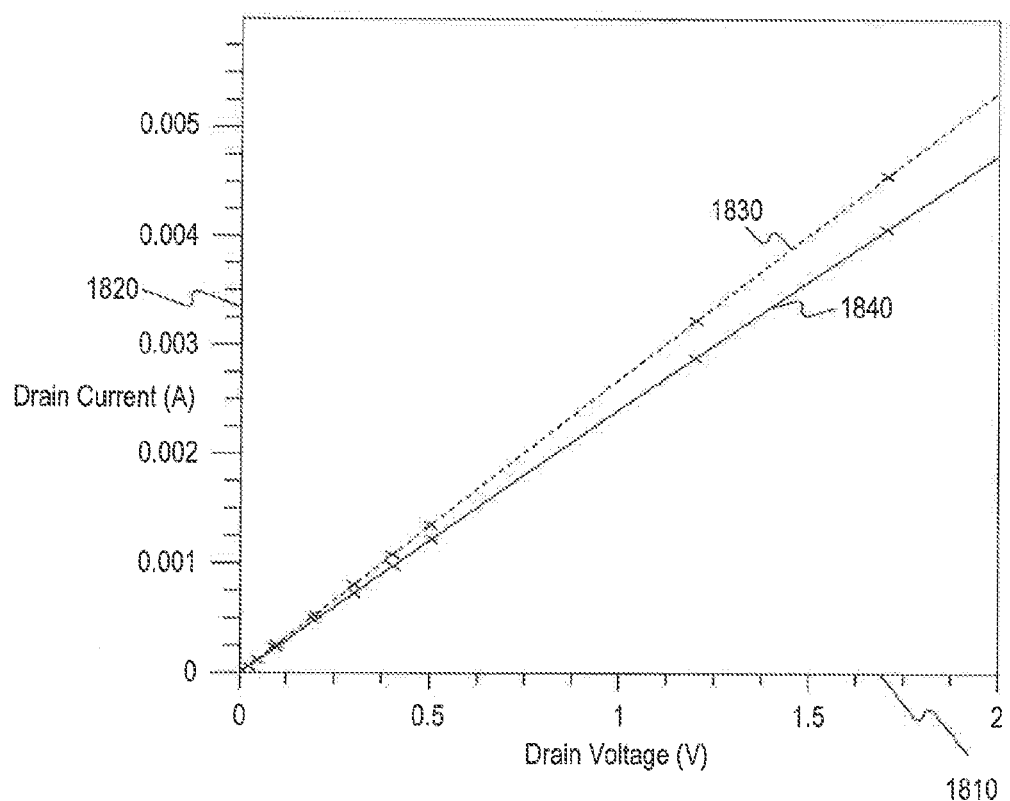
FIG. 18 is a graphical representation of a simulation result showing current vs. voltage characteristics of the semiconductor device of FIGS. 1A-1C and a comparative device according to a comparative example.

FIG. 18 is a graphical representation of a simulation result showing current vs. voltage characteristics of device 10 according to the illustrated embodiment and a comparative device according to a comparative example. The comparative device has a similar structure as device 10, except that the comparative device does not include gradient implant region 130. In the graph of FIG. 18, abscissa 1810 represents a drain voltage (i.e., the voltage applied between first M1 portion 181 and third M1 portion 183 of device 10) in volts V, and ordinate 1820 represents a drain current (i.e., the current measured between first M1 portion 181 and third M1 portion 183 of device 10) in amperes A. Curve 1830 represents the current vs. voltage characteristic of device 10. Curve 1840 represents the current vs. voltage characteristic of the comparative device. In the simulation, the drain voltage denoted on abscissa 1810 as "Drain Voltage (V)," is increased from 0V to 2V. A gate-source voltage $V_{gs}$ (i.e., the voltage applied between second M1 portion 182 and third M1 portion 183 of device 10) is maintained at 20 V. A bulk-source voltage $V_{bs}$ (i.e., the voltage applied between fourth M1 portion 184 and third M1 portion 183 of device 10) is maintained at 0V. As illustrated in FIG. 18, when the drain voltage is 1V, the drain current of device 10 is about 10.6% higher than the drain current of the comparative device. Accordingly, the specific on-resistance of device 10 is lower by about 10.6% compared to the comparative device when the drain voltage is 1V.

Figure 19:
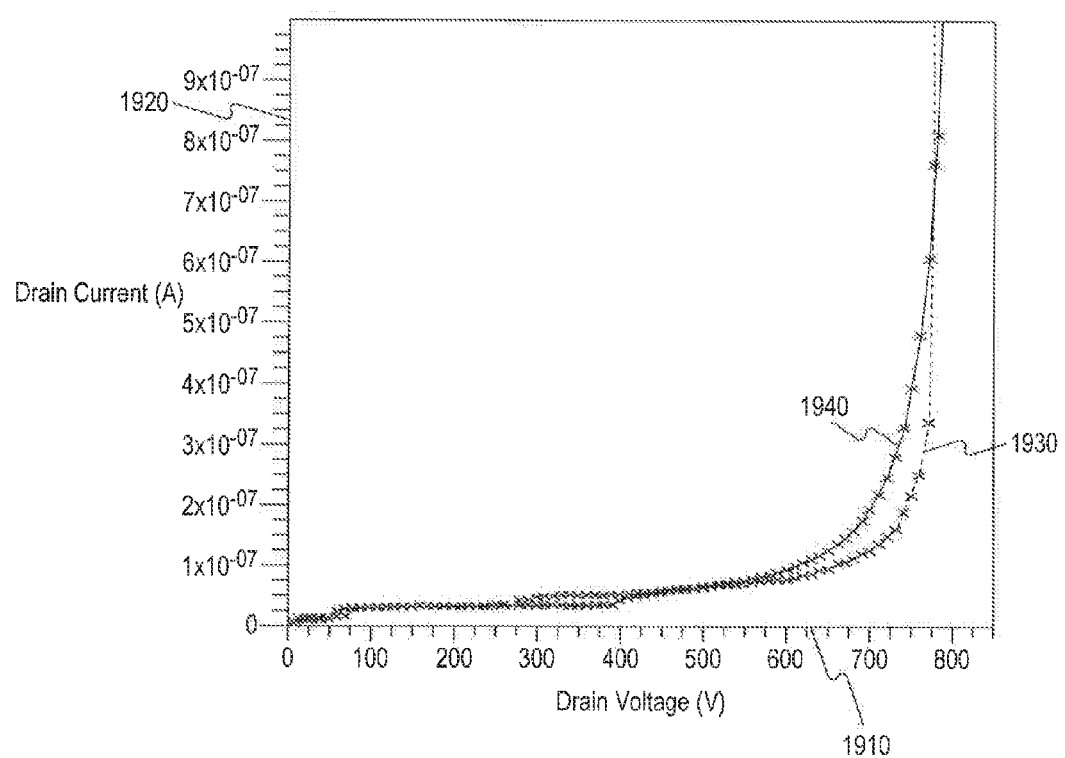
FIG. 19 is a graphical representation of a simulation result showing breakdown characteristics of the semiconductor device of FIGS. 1A-1C and the comparative device according to the comparative example.

FIG. 19 is a graphical representation of a simulation result showing breakdown characteristics of device 10 according to the illustrate embodiment and the comparative device according to the comparative example. In the graph of FIG. 19, abscissa 1910 represents a drain voltage in volts V, and ordinate 1920 represents a drain current in amperes A. Curve 1930 represents the current vs. voltage characteristic of device 10. Curve 1940 represents the current vs. voltage characteristic of the comparative device. In the simulation, the drain voltage denoted on abscissa 1910 as "Drain Voltage (V)," is increased from 0V to 900V, and a gate-source voltage $V_{gs}$ and a bulk-source voltage $V_{bs}$ are maintained at 0V. As illustrated in FIG. 19, the off-breakdown voltage of both of device 10 and comparative device is about 750V. Accordingly, the breakdown characteristic of device 10 is similar to that of the comparative device, and the off-breakdown voltage of device 10 is not materially affected by the addition of gradient implant region 130.

While the embodiment described with reference to FIGS. 1A-1C is directed to an ultra-high voltage (ultra-HV) NMOS device having a breakdown voltage of about 300V to 1000V, those skilled in the art will now appreciate that the disclosed concepts are equally applicable to P-type MOS (PMOS) devices. Those skilled in the art will also appreciate that the disclosed concepts are applicable to other ultra-HV devices, such as ultra-HV insulated-gate bipolar transistor (IGBT) devices and ultra-HV high-voltage diodes.

Figure 20A:
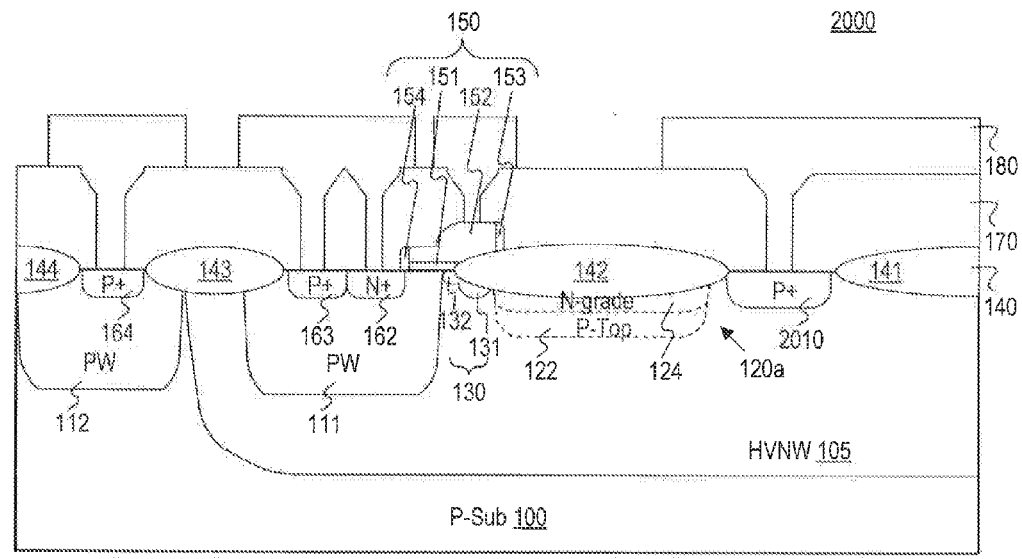
FIGS. 20A and 20B are cross-sectional views of an ultra-HV IGBT device, according to an illustrated embodiment.
Figure 20B:
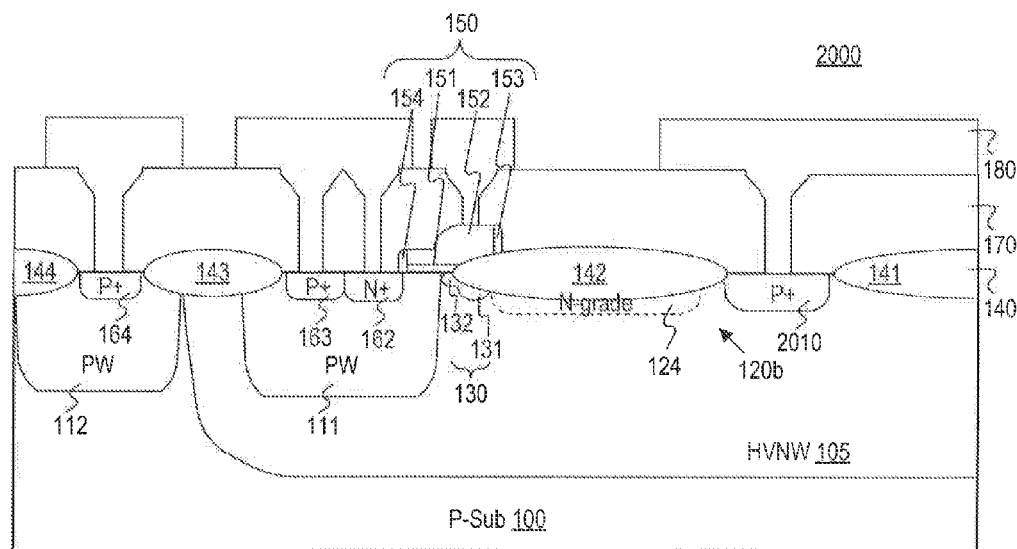

FIGS. 20A and 20B are cross-sectional views of an ultra-HV IGBT device 2000, according to an illustrated embodiment. FIG. 20A is a cross-sectional view of ultra-HV IGBT device 2000 taken along a section line corresponding to section line B-B' of FIG. 1A. FIG. 20B is a cross-sectional view of ultra-HV IGBT device 2000 taken along a section line corresponding to section line C-C' of FIG. 1A. One distinction between ultra-HV IGBT device 2000 and device 10 is that first N+-region 161 of device 10 is replaced with a P+-region 2010. In ultra-HV IGBT device 2000 illustrated in FIGS. 20A and 20B, P+-region 2010 constitutes a collector region, gate structure 150 constitutes a base region, while second N+-region 162 and first P+-region 163 together constitutes an emitter region.

Figure 21A:
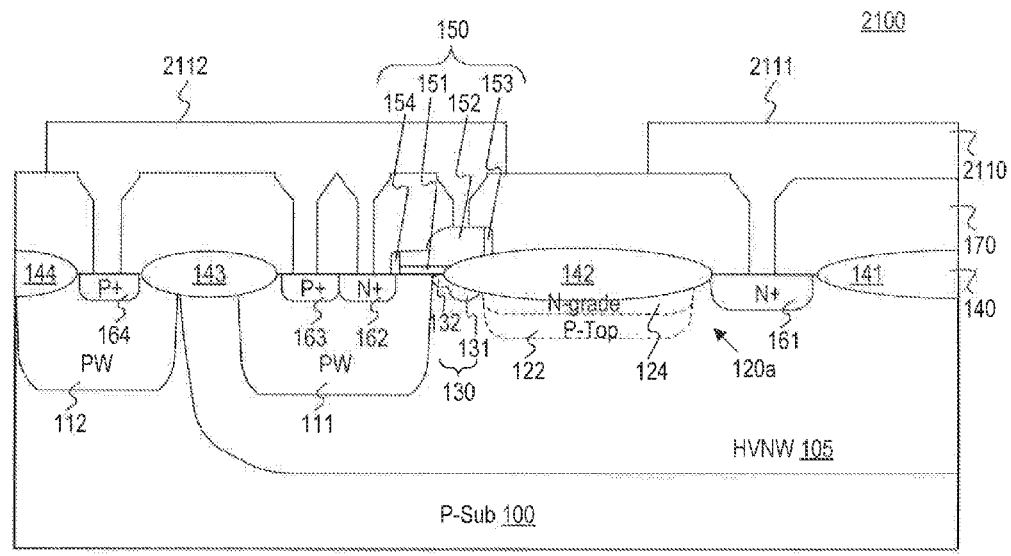
FIGS. 21A and 21B are cross-sectional views of an ultra-HV diode, according to an illustrated embodiment.
Figure 21B:
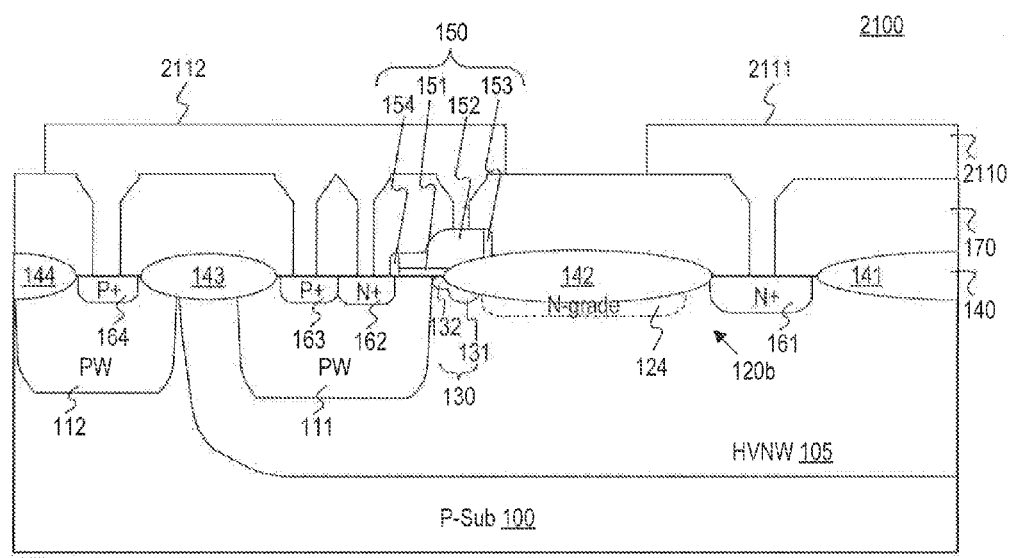

FIGS. 21A and 21B are cross-sectional views of an ultra-HV diode 2100, according to an illustrated embodiment. FIG. 21A is a cross-sectional view of ultra-HV diode 2100 taken along a section line corresponding to section line B-B' of FIG. 1A. FIG. 21B is a cross-sectional view of ultra-HV diode 2100 taken along a section line corresponding to section line C-C' of FIG. 1A. One distinction between ultra-HV diode 2100 and device 10 is that contact layer 180 of device 10 is replaced with a contact layer 2110. Contact layer 2110 includes a first contact portion 2111 that conductively contacts first N+-region 161, and a second contact portion 2112 that conductively contacts gate layer 152, second N+-region 162, first P+-region 163, and second P+-region 164. First contact portion 2111 constitutes an N-type terminal of ultra-HV diode 2100, and second contact portion 2112 constitutes a P-type terminal of ultra-HV diode 2100.

While in the embodiment described with reference to FIGS. 1A-1C, gradient implant region 130 is disposed next to the left-side edge of drift region 120 and the right-side edge of source well 111, a width of gradient implant region 130 along the horizontal direction can be variable. In addition, a depth of gradient implant region 130 along a direction perpendicular to the major surface of substrate 100 can be variable. In one embodiment as illustrated in FIG. 1B, the width of gradient implant region 130 along the horizontal direction is less than the width of gate layer 152 along the horizontal direction parallel to the major surface of substrate 100. In another embodiment, the right-side portion of gradient implant region 130 can further extend to the right to overlap the left-side edge portion of drift region 120, and the left-side portion of gradient implant region 130 can further extend to the left to overlap the right-side edge portion of source well 111.

Figure 22A:
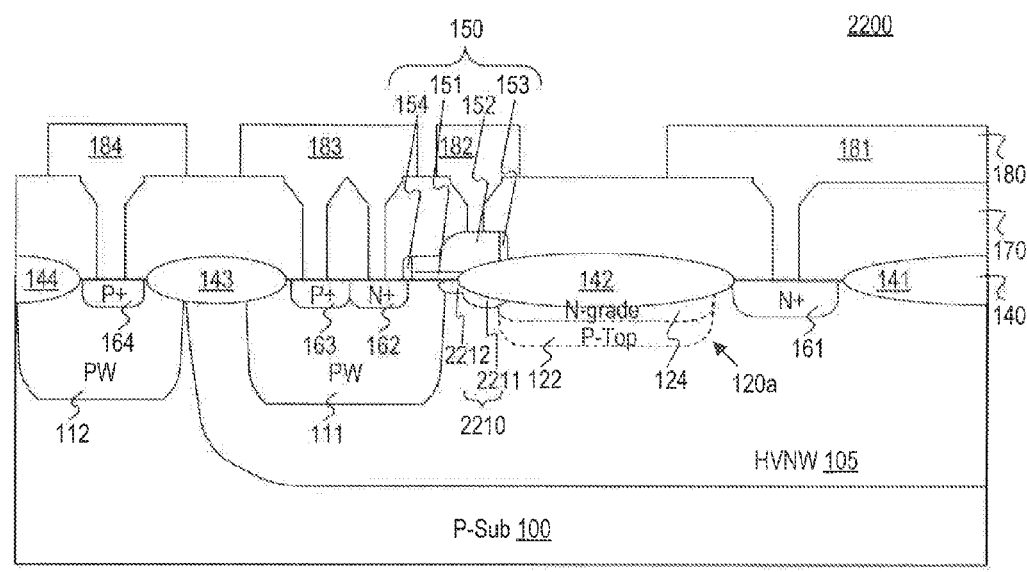
FIGS. 22A and 22B are cross-sectional views of a semiconductor device, according to an illustrated embodiment.
Figure 22B:
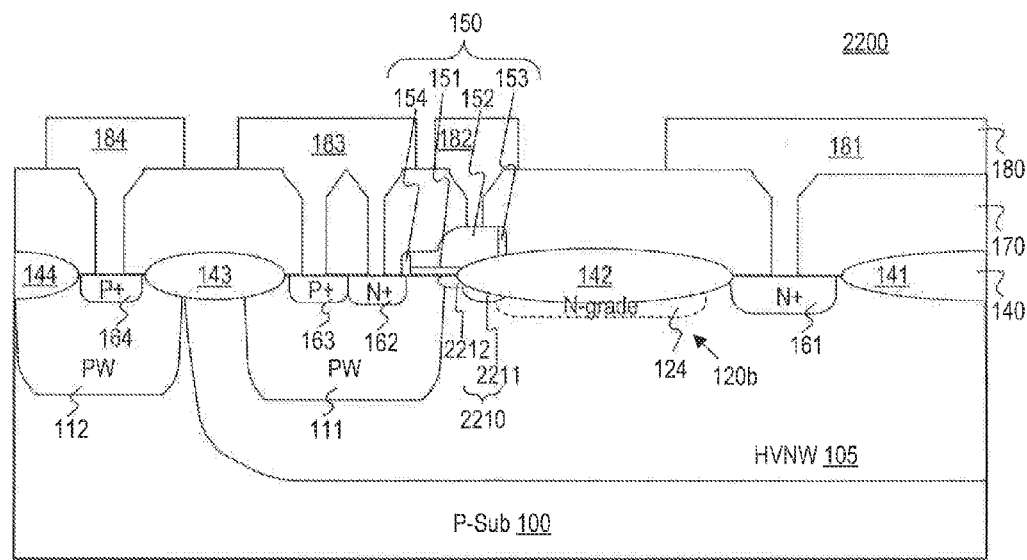

FIGS. 22A and 22B are cross-sectional views of a semiconductor device 2200, according to an illustrated embodiment. FIG. 22A is a cross-sectional view of device 2200 taken along a section line corresponding to section line B-B' of FIG. 1A. FIG. 22B is a cross-sectional view of device 2200 taken along a section line corresponding to section line C-C' of FIG. 1A. One distinction between device 2200 and device 10 is that gradient implant region 130 is replaced with a gradient implant region 2210. Gradient implant region 2210 has a greater width than that of gradient implant region 130. Gradient implant region 2210 includes a first portion 2211 and a second portion 2212. First portion 2211 overlaps the left-side edge portion of drift region 120. Second portion 2212 overlaps the right-side edge portion of source well 111.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor device, comprising:
a substrate having a first conductivity type;
a high-voltage well having a second conductivity type and disposed in the substrate;
a source well having the first conductivity type disposed in the high-voltage well;
a drift region disposed in the high-voltage well and spaced apart from the source well; and
a gradient implant region having the second conductivity type and disposed in the high-voltage well between the source well and the drift region.

2. The semiconductor device of claim 1, wherein the gradient implant region includes:
a first portion disposed close to the drift region; and
a second portion disposed close to the source well,
a doping concentration of the first portion being higher than a doping concentration of the second portion.

3. The semiconductor device of claim 2, wherein a depth of the first portion is greater than a depth of the second portion.

4. The semiconductor device of claim 1, further including:
a gate oxide layer disposed on the substrate between the source well and the drift region; and
a gate layer disposed on the gate oxide layer.

5. The semiconductor device of claim 4, wherein the gate oxide layer overlaps an edge portion of the source well.

6. The semiconductor device of claim 4, further including an insulation layer having a portion disposed on the drift region,
the gradient implant region including a first portion disposed close to the drift region and a second portion disposed close to the source well,
the gate oxide layer being disposed adjacent to the portion of the insulation layer disposed on the drift region, and
the gate oxide laying overlapping the second portion of the gradient implant region.

7. The semiconductor device of claim 4, wherein a width of the gate layer is greater than a width of the gradient implant region.

8. The semiconductor device of claim 1, wherein the gradient implant region overlaps an edge portion of the drift region.

9. The semiconductor device of claim 1, wherein the gradient implant region overlaps an edge portion of the source well.

10. The semiconductor device of claim 1, further including:
   a second well disposed outside of the high-voltage well; and
   a bulk region disposed in the second well.

11. The semiconductor device of claim 1, wherein the drift region includes a plurality of alternately arranged first sections and second sections,
   each first section including a top region having the first conductivity type and a grade region having the second conductivity type disposed on the top region, and
   each second section including the grade region.

12. The semiconductor device of claim 1, wherein the semiconductor device is a metal oxide semiconductor (MOS) device,
   the semiconductor device further including a drain region formed of a heavily doped region having the second conductivity type.

13. The semiconductor device of claim 1, wherein the semiconductor device is an insulated gate bipolar transistor,
   the semiconductor device further including a collector region formed of a heavily doped region having the first conductivity type.

14. A method for manufacturing a semiconductor device, comprising:
   providing a substrate having a first conductivity type;
   forming a high-voltage well having a second conductivity type in the substrate;
   forming a source well having the first conductivity type in the high-voltage well;
   forming a drift region in the high-voltage well and spaced apart from the source well; and
   forming a gradient implant region having the second conductivity type in the high-voltage well between the source well and the drift region.

15. The method of claim 14, wherein the forming the gradient implant region includes:
   forming a first portion disposed close to the drift region; and
   forming a second portion disposed close to the source well,
   a doping concentration of the first portion being higher than a doping concentration of the second portion.

16. The method of claim 15, wherein the first portion is formed to have a greater depth than a depth of the second portion.

17. The method of claim 14, wherein the forming the gradient implant region includes:
   forming the gradient implant region to overlap an edge portion of drift region.

18. The method of claim 14, wherein the forming the gradient implant region includes:
   forming the gradient implant region to overlap an edge portion of the source well.

19. The method of claim 14, wherein the drift region includes a plurality of alternately arranged first sections and second sections,
   the forming a drift region in the high-voltage well including:
      forming a top region having the first conductivity type in the first sections; and
      forming a grade region having the second conductivity type in both of the first sections and the second sections.

20. The method of claim 14, further including:
   forming a gate oxide layer on the substrate between the source well and the drift region; and
   forming a gate layer on the gate oxide layer.

* * * * *